United States Patent
Anghel et al.

(10) Patent No.: US 9,252,269 B2
(45) Date of Patent: Feb. 2, 2016

(54) TUNNEL EFFECT TRANSISTOR

(71) Applicant: Commissariat à l'énergie atomique et aux énergies alternatives, Paris (FR)

(72) Inventors: Costin Anghel, Vanves (FR); Cyrille Le Royer, Tullins-Fures (FR); Adam Makosiej, Grenoble (FR)

(73) Assignee: Commissariat à l'ènergie atomique et aux ènergies alernatives, Paris (FR)

( * ) Notice: Subject to any disclaimer, the term of this patent is extended or adjusted under 35 U.S.C. 154(b) by 0 days.

(21) Appl. No.: 14/199,501

(22) Filed: Mar. 6, 2014

(65) Prior Publication Data

US 2014/0252407 A1 Sep. 11, 2014

(30) Foreign Application Priority Data

Mar. 6, 2013 (FR) ...................................... 1352029

(51) Int. Cl.
*H01L 29/78* (2006.01)
*H01L 29/739* (2006.01)
*H01L 29/06* (2006.01)
H01L 29/417 (2006.01)

(52) U.S. Cl.
CPC ........ *H01L 29/7833* (2013.01); *H01L 29/0657* (2013.01); *H01L 29/7391* (2013.01); *H01L 29/41775* (2013.01)

(58) Field of Classification Search
CPC . H01L 29/78; H01L 29/0657; H01L 29/7391; H01L 29/7833; H01L 29/41775; H01L 21/336
See application file for complete search history.

(56) References Cited

U.S. PATENT DOCUMENTS

| | | |
|---|---|---|
| 5,936,265 A | 8/1999 | Koga |
| 2010/0059737 A1* | 3/2010 | Bhuwalka et al. ............... 257/28 |
| 2010/0315884 A1* | 12/2010 | Toh et al. .................. 365/185.29 |

FOREIGN PATENT DOCUMENTS

CN 102 832 256 12/2012

OTHER PUBLICATIONS

Search Report and Written Opinion as issued for French Patent Application No. 1352029, dated Oct. 16, 2013.
Hu, et al., "Green Transistor—A $V_{DD}$ Scaling Path for Future Low Power ICs," IEEE, 2008, 2 pages.

* cited by examiner

*Primary Examiner* — Michael Jung
*Assistant Examiner* — Charles R Peters
(74) *Attorney, Agent, or Firm* — Pillsbury Winthrop Shaw Pittman LLP

(57) ABSTRACT

A tunnel effect transistor includes a channel made of an intrinsic semiconductor material; source and drain extension regions on either side of the channel, the source extension region being made of a semiconductor material doped according to a first type of doping P or N and the drain extension region being made of a semiconductor material doped according to a second type of doping opposite to said first type of doping; source and drain conductive regions respectively in contact with the source and drain extension regions; a gate structure including a gate dielectric layer in contact with the channel and a gate area arranged such that the gate dielectric layer is arranged between the gate area and the channel; and an area doped according to the first type of doping inserted between the channel and the drain extension region.

10 Claims, 9 Drawing Sheets

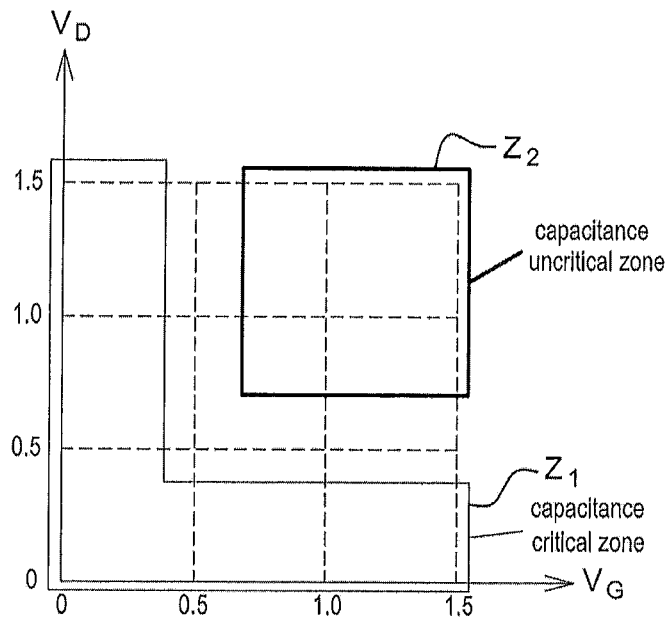
Fig. 3
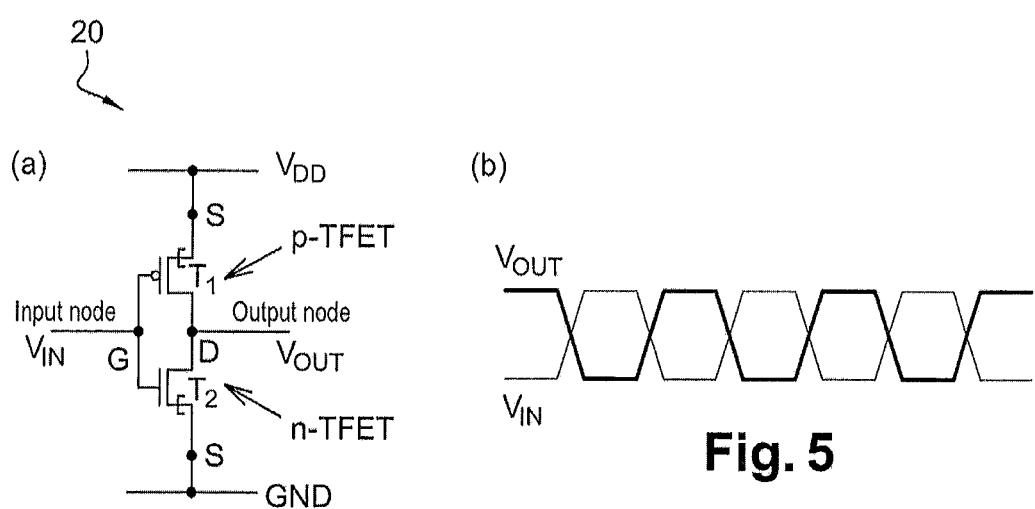
Fig. 4
Fig. 5

TUNNEL EFFECT TRANSISTOR

CROSS-REFERENCE TO RELATED APPLICATIONS

This application claims priority to French Patent Application No. 1352029, filed Mar. 6, 2013, the entire content of which is incorporated herein by reference in its entirety.

FIELD

The present invention relates to the field of microelectronics and more particularly relates to a tunnel effect transistor.

BACKGROUND

Generally speaking, Tunnel Field Effect Transistors (TFET) are increasingly envisaged for replacing CMOS type transistors, particularly for low power applications. Tunnel effect (also known as tunnel junction) transistors are gate PiN diodes where the current in the on state comes from carriers passing from band to band by tunnel effect. TFET have in fact very low leakage currents $I_{off}$ (current in the off state of the transistor) as well as low subthreshold slopes (SS) compared to CMOS transistors of similar dimension. An example of structure of a double gate N type TFET 1 is illustrated in FIG. 1. The TFET 1 is based on a PiN diode architecture with one gate and comprises:

- a p+ doped source semiconductive area 2;
- an intrinsic central channel semiconductive area 3;
- an n+ doped drain semiconductive area 4;
- two gate areas 5 and 6, for example metallic, above and below the intrinsic area 3 and separated therefrom by a gate dielectric layer (respectively 7 and 8).

The dielectric material of the gate dielectric layer is usually a material with high dielectric constant, referred to as "high-k" material; such a material makes it possible in particular to obtain better conduction currents.

On either side of the source area 2 there are source conductive areas 9 and 10 (for example made of NiSi) formed for example by silicidation.

Similarly, on either side of the drain area 4 there are drain conductive areas 11 and 12 (for example made of NiSi) formed for example by silicidation.

The source conductive areas 9 and 10 are respectively isolated from the gate areas 5 and 6 (and their associated dielectric layer) by spacers 13 and 14.

The drain conductive areas 11 and 12 are respectively isolated from the gate areas 5 and 6 (and their associated dielectric layer) by spacers 15 and 16.

FIG. 2 illustrates the band diagrams of the device 1 as a function of the position along the device 1 and according to the voltages applied to the gate, to the drain and to the source.

The operating principle is the following: by applying a positive voltage at the level of the drain (here VD=1V), the PiN diode is reverse biased thereby creating a potential barrier such that a very low current $I_{off}$ is obtained in off mode. By applying a positive gate voltage (here VG=1.6V), the probability of tunnel transition on the source side is increased by bringing together the valence and conduction bands. The transport is then assured by the source/drain electrical field.

As mentioned above, one of the advantages of the TFET is that it offers a very low leakage current $I_{off}$ compared to a CMOS transistor (and thus a reduced dissipated power in off mode).

One of the problems of TFET resides nevertheless in their dynamic operating performance. Two reasons explain the relatively poor dynamic operating performances.

Firstly, TFET have a weak conduction current intensity $I_{on}$ (i.e. current in the on state of the transistor) compared to the values of $I_{on}$ obtained for CMOS transistors of similar dimension.

Moreover, TFET have high parasitic capacitances, particularly the gate-drain capacitance also known as Miller capacitance: in increasing, these parasitic capacitances reduce the dynamic operating frequency.

SUMMARY

In this context, an aspect of the present invention is to provide a tunnel effect transistor having improved dynamic operating characteristics.

To this end, there is provided in an embodiment of the present invention a tunnel effect transistor comprising:

- a channel made of an intrinsic semiconductor material;
- source and drain extension regions on either side of the channel, the source extension region being made of a semiconductor material doped according to a first type of doping P or N and the drain extension region being made of a semiconductor material doped according to a second type of doping opposite to the first type of doping, the source extension region serving to inject by tunnel effect charge carriers into the channel;
- source and drain conductive regions respectively in contact with the source and drain extension regions;
- a gate structure comprising:
- a gate dielectric layer in contact with the channel;
- a gate area arranged such that the gate dielectric layer is arranged between the gate area and the channel;
- the transistor comprising an area doped according to the first type of doping between the channel and the drain extension region, the doped area forming a barrier, preventing the charge carriers from escaping from the drain extension region.

As will be seen hereafter, an aspect of the invention is based on the observation that parasitic capacitances are particularly bothersome for strong gate voltages (VG) accompanied by weak drain voltages (VD).

The high capacitances at strong VG and weak VD arise from the fact that the high voltage applied to the gate generates within the transistor states available to receive electrons by tunnel effect. These states are filled by electrons coming from the drain. These states, within the transistor, constitute a charge totally connected with the drain which behaves like a Miller type parasitic capacitance, connected between the gate and the drain. The electrons are attracted by the gate voltage and then invade the channel.

Thanks to an embodiment of the invention, the p+ type (in the case of an n+ doped drain extension region) or n+ type (in the case of a p+ doped drain extension region) doping area inserted between the intrinsic channel region and the drain extension region makes it possible to create a drain side barrier preventing the electrons from escaping from the drain and penetrating into the channel at strong VG and weak VD.

The transistor according to an embodiment of the invention may also have one or more of the following characteristics, considered individually or according to any technically possible combinations thereof:

- the concentration of dopants of the area doped according to the first type of doping is comprised between $10^{19}$ cm$^{-3}$ and $5 \cdot 10^{19}$ cm$^{-3}$;

the concentration of dopants of the area doped according to the first type of doping is substantially equal to $3 \cdot 10^{19}$ cm$^{-3}$;

the area doped according to the first type of doping is inserted over a given length Lb and measured along the longitudinal direction of the channel;

the length Lb is comprised between 5 and 20 nm;

the area doped according to the first type of doping is inserted over a given thickness and measured perpendicularly to at least one conduction plane of the channel;

the thickness is comprised between 8 and 20 nm;

the channel comprises:

a first part oriented along the longitudinal direction of the channel and having a given thickness ts1 and;

at least one diversion extending along a direction perpendicular to at least one conduction plane of the channel and having a thickness strictly greater than the thickness ts1, the area doped according to the first type of doping being in the extension of the diversion;

the transistor according to an embodiment of the invention comprises a spacer isolating the drain conductive region and the gate area, the spacer having a thickness measured parallel to the longitudinal direction of the channel comprised between 5 nm and 10 nm;

the drain and source conductive regions extend respectively above and/or below the source and drain extension regions;

the channel has at least two conduction planes, the area doped according to the first type of doping being inserted over a thickness measured perpendicularly to each of the conduction planes of the channel.

BRIEF DESCRIPTION OF THE DRAWINGS

Other characteristics and benefits of the invention will become clear from the description that is given thereof hereafter, as an indication and in no way limiting, while referring to the appended figures, among which:

FIG. 3 illustrates schematically the section of the VG-VD space of a TFET;

FIG. 4 represents schematically a TFET inverter;

FIG. 5 represents the responses of the input and of the output of the TFET inverter of FIG. 4;

In all the figures, common components bear the same reference numbers. For reasons of clarity, only components useful for the understanding of the invention have been represented, without respect for scale and in a schematic manner.

DETAILED DESCRIPTION

Figure 1:
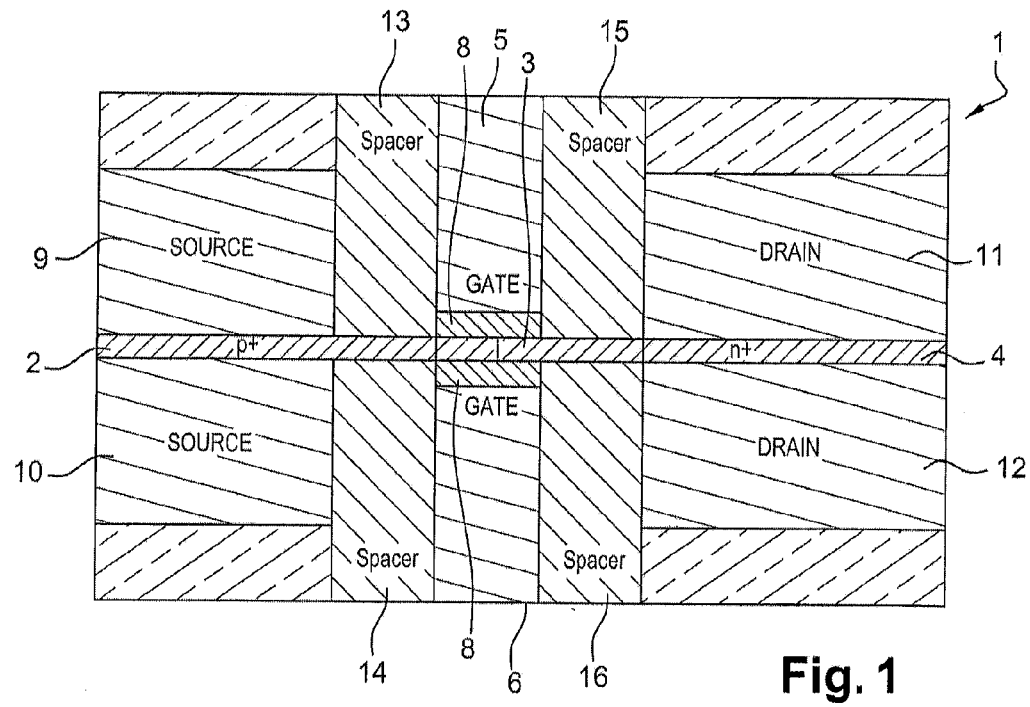
FIG. 1 illustrates an example of structure of a TFET according to the prior art.
Figure 2:
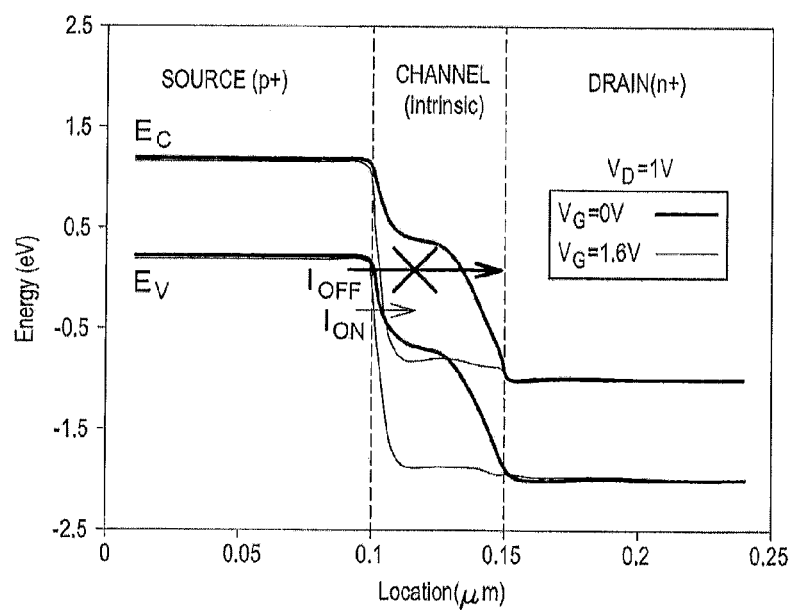
FIG. 2 represents the band diagram of the transistor of FIG. 1.

FIG. 3 illustrates schematically the breakdown of the space of the drain voltage VD as a function of the gate voltage VG of a TFET. This figure has the aim of illustrating the existence of two areas;

a first area Z1 in which the capacitance values are very high and should be the lowest possible to have a rapid switching (as a reminder, the increase of the parasitic capacitance value leads to a reduction of the dynamic operating frequency of the TFET);

a second area Z2 in which the parasitic capacitance values are not critical for the switching.

The presence of these two areas Z1 and Z2 will be better understood with regard to FIGS. 4 and 5 which represent respectively and schematically a TFET inverter 20 and the responses of the input Vin and the output Vout of the TFET inverter.

In a known manner, the TFET inverter 20 comprises a tunnel effect transistor T1 of P type (p-TFET) and a tunnel effect transistor T2 of N type (n-TFET) connected by their common drain D, the source S of the p-TFET T1 being connected to a supply voltage VDD and the source S of the n-TFET T2 being connected to the ground GND.

The logical operating principle of the TFET inverter 20 is the following: if the input of the inverter changes from a logic "0" to a logic "1", the output changes from a logic "1" to a logic "0" as illustrated in FIG. 5. Conversely, if the input of the inverter changes from a logic "1" to a logic "0", the output changes from a logic "0" to a logic "1".

Thus, for the switching, the following two situations can exist:

In a first situation, VIN=0 and VOUT=1. According to this first situation, the p-TFET is biased at VSG=VS−VG=VDD and VSD=VS−VD=0V and the n-TFET is biased at VGS=VG−VS=0V and VDS=VD−VS=VDD.

In a second situation, VIN=1 and VOUT=0. According to this second situation, the p-TFET is biased at VSG=0V and VSD=VDD and the n-TFET is biased at VGS=VDD and VDS=0V.

This presentation of extreme cases demonstrates that, during switching, the p-TFET and n-TFET transistors do not arrive simultaneously in the conditions of bias at high VG and VD. Thus, it will be understood that it is interesting to minimise the parasitic capacitances in the surface delimited by the area Z1 of FIG. 3.

The parasitic capacitances have relatively low values for weak VG and strong VD. The low values of the parasitic capacitances at weak VG and strong VD are explained by the absence of available states to receive electrons by tunnel effect. Moreover, the strong drain voltage VD leads to a complete desertion of the carriers.

Conversely, the parasitic capacitances are high at strong VG and weak VD. As mentioned above, the high capacitances at strong VG and weak VD arise from the fact that the high voltage VG applied to the gate generates within the transistor states available for receiving electrons by tunnel effect. These states are filled by electrons coming from the drain. These states, within the transistor, constitute a charge totally connected with the drain which behaves like a Miller type parasitic capacitance, connected between the gate and the drain. The electrons are attracted by the gate voltage and then invade the channel.

On the basis of this latter observation, an aspect of the invention aims to reduce the parasitic capacitances in the situation with strong VG and weak VD.

Figure 6:
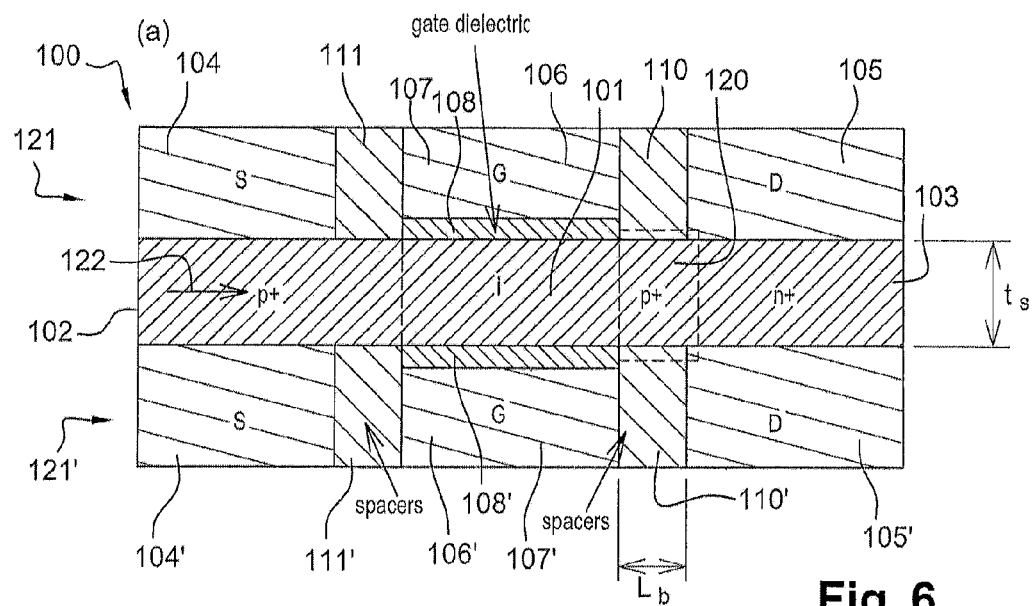
FIG. 6 represents the structure of a tunnel effect transistor according to an embodiment of the invention.

FIG. 6 represents schematically the structure of a double gate tunnel effect transistor TFET 100 according to an embodiment of the invention.

Hereafter, the association of the notation "'" (prime) with a numerical reference of a component of FIG. 6 indicates that it is a lower component (i.e. below the channel extended on either side by the drain and source extension regions) symmetrical with an upper component (i.e. above the channel extended on either side by the drain and source extension regions).

The tunnel effect transistor 100 is here an N type transistor comprising a PIN diode architecture including:
- a central channel 101 made of an intrinsic semiconductor material (for example silicon); intrinsic semiconductor is taken to mean a semiconductor material in which the electrical behaviour only depends on its structure, and not on the addition of doping impurities;
- a source extension region 102 extending the channel 101 at one of its ends and made of a highly P doped semiconductor material of P+ type (for example Boron-doped Si)—this source extension region 102 serving to inject by tunnel effect charge carriers into the channel;
- a drain extension region 103 extending the channel 101 at the other of its ends and made of a highly N doped semiconductor material of N+ type (for example Phosphorus-doped Si);
- a barrier area 120 inserted between the channel 101 and the drain extension region 103, the barrier area 120 being made of a highly P doped semiconductor material of P+ type (for example Boron-doped Si).

Throughout the document, length is taken to mean the length measured along the longitudinal direction of the channel (marked by the arrow 122) and thickness is taken to mean a dimension measured along a direction perpendicular to the plane containing the channel 101.

According to this first embodiment, the P+ barrier area 120 is inserted over a length Lb along the longitudinal direction of the channel 101 between the latter and the drain extension area 103. It will be noted that the thickness $t_S$ of the source 102, drain 103 extension regions and of the channel 101 is here globally constant; this latter characteristic is absolutely not limiting and it is also possible to have raised drain or source extension regions without going beyond the scope of the present invention (cf. for example the source extension region 202' of the embodiment represented in FIG. 11 which will be described in greater detail hereafter).

Beneficially, this length Lb is comprised between 5 and 20 nm.

In an embodiment, the concentration of acceptors (for obtaining a P+ type doping) of the barrier area 120 is comprised between $10^{19}$ cm$^{-3}$ and $5 \cdot 10^{19}$ cm$^{-3}$. As a comparison, the concentration of acceptor dopants in the source extension region 102 is comprised between $10^{20}$ cm$^{-3}$ and $5 \cdot 10^{20}$ cm$^{-3}$ (i.e. a concentration around ten times higher than that of the barrier area 120). Beneficially, the concentration of acceptors (P+ type doping) of the barrier area 120 is substantially equal to $3 \cdot 10^{19}$ cm$^{-3}$. It will be noted that the concentration of donors (N+ type doping) in the drain extension region 103 has little influence on the value on the concentration of acceptors of the barrier area 120. An increase in the concentration of the p+ area beyond the aforementioned values (for example to $7 \times 10^{19}$ cm$^{-3}$) induces a reduction in the supply voltage (otherwise the appearance of strong parasitic currents are observed in the off state of the transistor via a parasitic tunnel effect uncontrolled on the drain side).

In a known manner, the transistor 100 further comprises:
- an upper part 121 in the form of a series of successive components situated above the assembly formed by the channel 101 surrounded by extension regions 102 and 103 in the longitudinal direction (marked by the arrow 122) of the channel from the source extension region and incorporating:
  - a source conductive region 104;
  - an arrangement 111 for forming a source insulating space between the sides opposite each other of the source conductive region 104 and of the gate structure 106 that follows;
  - a gate structure 106 comprising:
    - a gate dielectric layer 108; the material of the dielectric layer 108 may be a dielectric material of high-k type such as HfO$_2$;
    - a gate conductive area 107 above the gate dielectric layer 108 and in contact therewith; the material of the gate conductive area 107 is for example a metal;
  - an arrangement 110 for forming a drain insulating space between the sides opposite each other of the gate structure 106 and of the drain conductive region 105 that follows;
  - a drain conductive region 105;
- a lower part 121' in the form of a series of successive components situated below the assembly formed by the channel 101 surrounded by extension regions 102 and 103, in the longitudinal direction of the channel from the source extension region and incorporating:
  - a source conductive region 104';
  - an arrangement 111' for forming a source insulating space between the sides opposite each other of the source conductive region 104' and of the gate structure 106' that follows;
  - a gate structure 106' comprising:
    - a gate dielectric layer 108'; the material of the dielectric layer 108' may be a high-k type dielectric material such as HfO$_2$;
    - a gate conductive area 107' above the gate dielectric layer 108' and in contact therewith; the material of the gate conductive area 107' is for example a metal;
  - an arrangement 110' for forming a drain insulating space between the sides opposite each other of the gate structure 106' and the drain conductive region 105' that follows;
  - a drain conductive region 105'.

In an embodiment, the assembly of the spacer is made of a low-k dielectric material such as SiO$_2$ it being understood that the arrangement is not necessarily formed of a single material and/or of a single layer. The dimensions measured along the longitudinal direction 122 of the channel 101 of the spacer 110 and 110' are for example of the order of 15 nm (comprised between 5 nm and 30 nm for a planar structure).

The p+ type barrier area 120 allows to create a drain side barrier preventing the electrons from escaping from the drain and penetrating into the channel at strong VG and weak VD. This phenomenon is particularly illustrated in FIGS. 7a to 7b which represents respectively the band diagram of the transistor 100 of FIG. 6 for two different gate voltages with a substantially zero drain voltage. FIG. 7c represents the superposition of the two diagrams of FIGS. 7a and 7b.

Figure 7A:
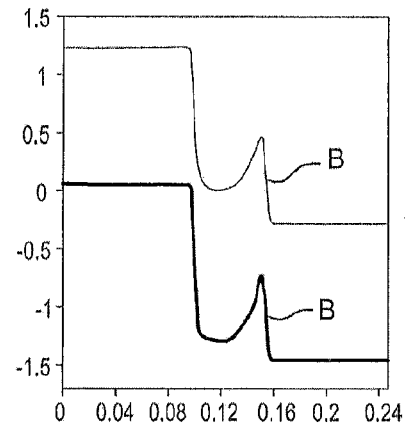
FIGS. 7a to 7c represents the band diagram of the transistor of FIG. 6 for several gate voltages with a quasi zero drain voltage according to an embodiment of the invention.
Figure 7B:
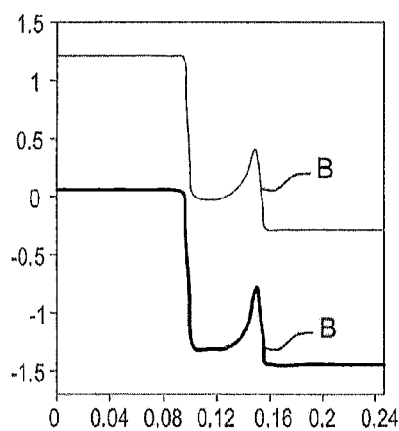
Figure 7C:
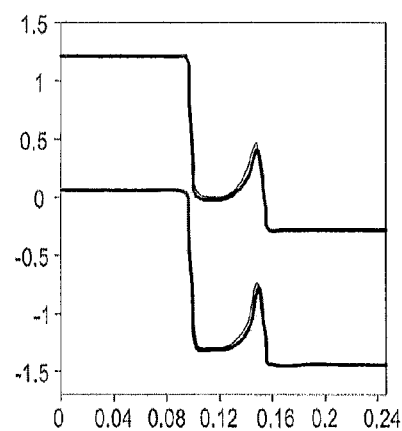

FIGS. 7a and 7b show that a barrier B has been created on the structure of the bands by the p+ type doping intersected between the channel (intrinsic) and the drain extension region (of n+ type) and that this barrier is present whatever the gate voltage. FIG. 7c demonstrates moreover that the barrier between the channel and the drain extension region is very slightly influenced by the bias of the gate (the B barrier remains substantially the same whatever the gate voltage). This B barrier created by the barrier area 120 of FIG. 6 prevents the penetration of electrons from the drain extension region 103 to the channel 101.

Figure 8:
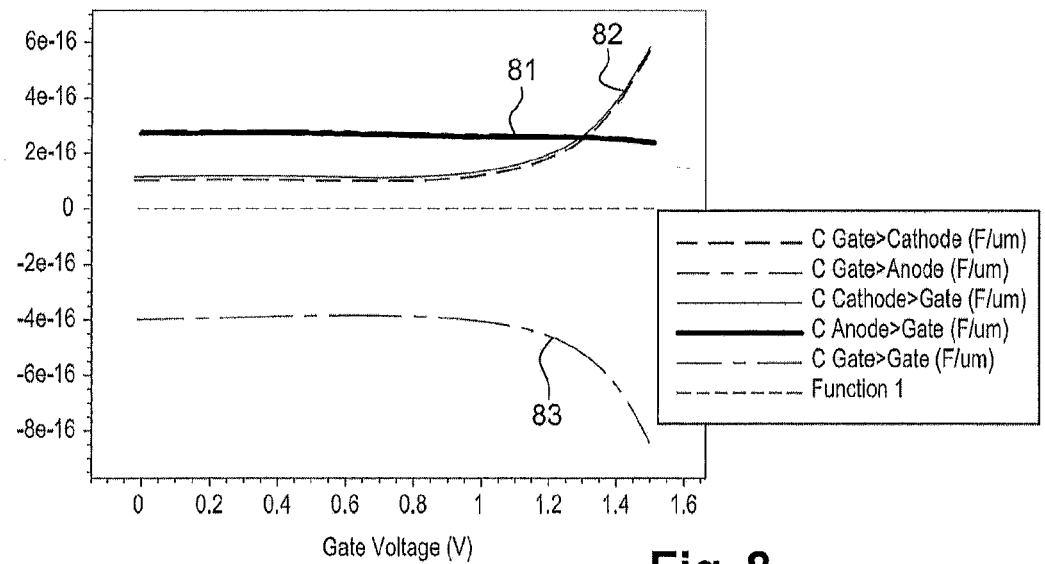
FIG. 8 illustrates the evolution of the parasitic capacitances as a function of the gate voltage for a transistor such as that of FIG. 6 according to an embodiment of the invention.

FIG. 8 illustrates the evolution of the parasitic capacitances (units: F/m) as a function of the gate voltage (units: V) for a transistor according to an embodiment of the invention such as that of FIG. 6:
   curve 81 represents the evolution of the parasitic capacitance between the source extension region and the gate;
   curve 82 represents the evolution of the parasitic capacitance between the gate and the drain extension region;
   curve 83 represents the evolution of the total parasitic capacitance.

Figure 9:
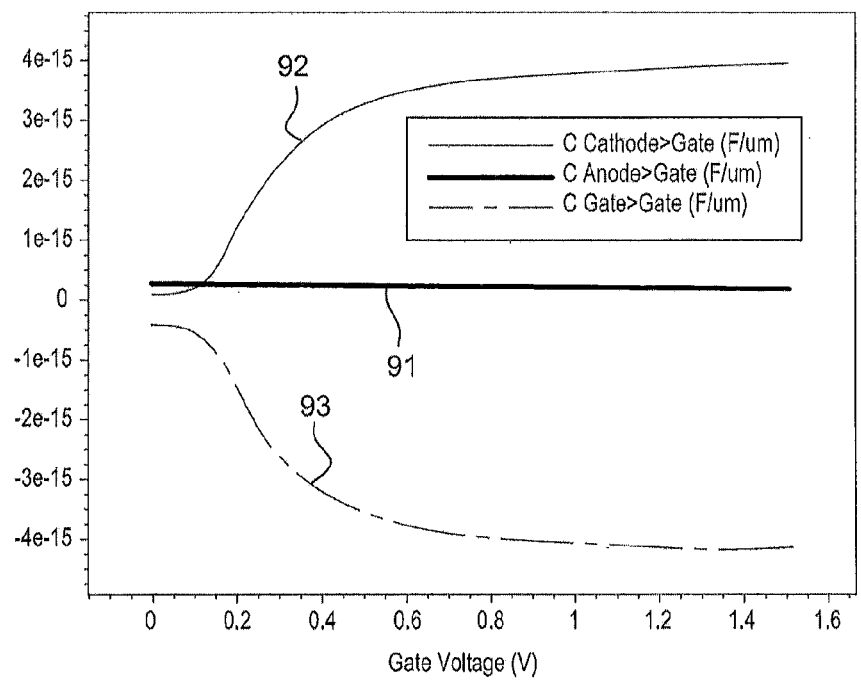
FIG. 9 illustrates the evolution of the parasitic capacitances as a function of the gate voltage for a transistor according to the prior art such as that represented in FIG. 1.

FIG. 9 illustrates the evolution of the parasitic capacitances (units: F/μm) as a function of the gate voltage (units: V) for a transistor of the prior art such as the transistor of FIG. 1:
   curve 91 represents the evolution of the parasitic capacitance between the source extension region and the gate;
   curve 92 represents the evolution of the parasitic capacitance between the gate and the drain extension region;
   curve 93 represents the evolution of the total parasitic capacitance.

It will be noted that certain capacitances have negative values and others positive values, but the sign of the capacitances does not have any signification: the absolute values of the capacitances should thus be compared.

The curves of FIGS. 8 and 9 were obtained for a substantially zero drain voltage.

FIG. 8 demonstrates that the parasitic capacitances are maintained at low values over a very wide gate voltage range (i.e. up to a gate voltage of 1V). It may be observed moreover that, with a structure according to an embodiment of the invention, the total parasitic capacitance, in other words curve 83 (which correspond substantially to the sum of the capacitances between the source extension region and the gate and between the gate and the drain extension region), is dominated up to VG=1V by the capacitance between the source extension region and the gate (curve 81). In other words, thanks to an embodiment of the invention, the effect of the capacitance between the gate and the drain extension region is considerably reduced. This behaviour is very similar to that observed for a transistor formed according to MOSFET technology.

Conversely, on analysing FIG. 9, it may be observed that the capacitances of a tunnel effect transistor according to the prior art are of an order of magnitude greater for a gate voltage VG less than or equal to 1V (one passes from a capacitance of the order of $4 \cdot 10^{-16}$ F/μm for the invention to a capacitance of the order of $4 \cdot 10^{-15}$ F/μm for the transistor according to the prior art). Moreover, it may be observed that the capacitance between the gate and the drain extension region (curve 92) has a considerable influence on the total capacitance (93). FIG. 9 shows high capacitances even at weak gate voltages (cf. VG=0.3V).

It will be noted that the curves 81 and 91 representing the capacitances between the source extension region and the gate are very similar: this result is understandable in so far as the barrier area according to an embodiment of the invention does not aim to reduce this parasitic capacitance.

Figure 10:
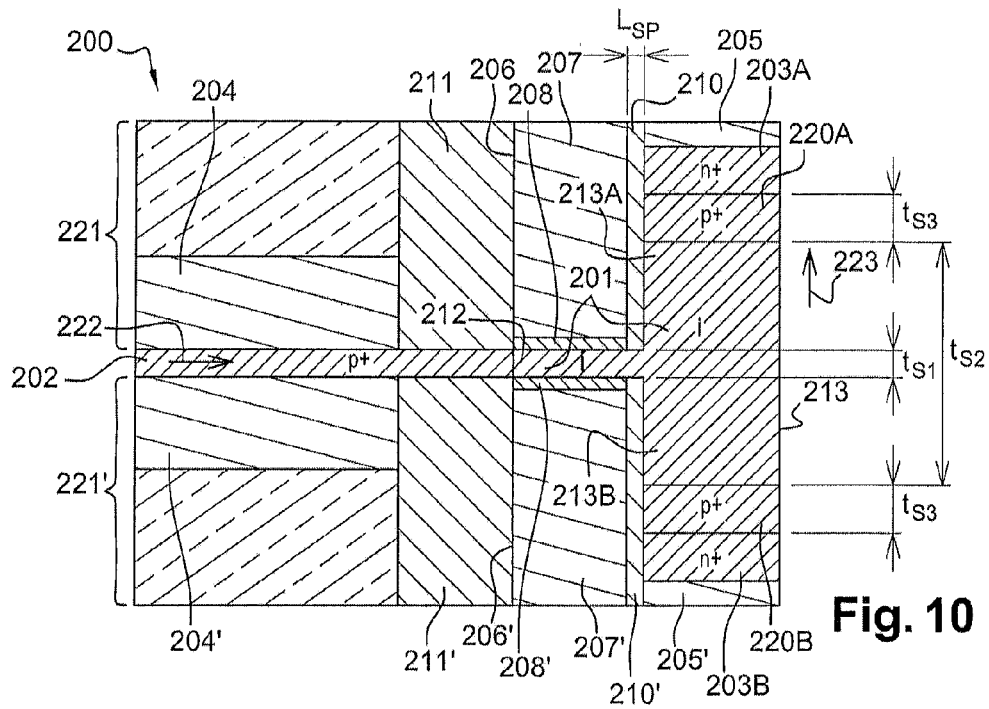
FIG. 10 represents schematically the structure of a double gate TFET tunnel effect transistor according to a second embodiment of the invention.

FIG. 10 represents schematically the structure of a double gate tunnel effect transistor TFET 200 according to a second embodiment of the invention.

The transistor 100 of FIG. 6 had a planar structure with a thickness $t_s$ substantially constant over the length of the source extension region, the channel and the drain extension region. The barrier area was thus inserted along the longitudinal direction of the channel while conserving this same constant thickness.

The transistor 200 according to an embodiment of the invention differs from the transistor 100 in that it has a vertical structure, in other words that the assembly formed by the drain extension region, the channel and the source extension region no longer extends along the longitudinal direction of the channel with a constant thickness.

Hereafter, the association of the notation "'" (prime) with a numerical reference of a component of FIG. 10 indicates that it is a lower component (i.e. below the channel extended on either side by the drain and source extension regions) symmetrical with an upper component (i.e. above the channel extended on either side by the drain and source extension regions).

Throughout the document, length is taken to mean the length measured along the longitudinal direction of the channel (marked by the arrow 222) and thickness is taken to mean a dimension measured along a direction perpendicular (marked by the arrow 223) to the plane of the channel (here the horizontal plane perpendicular to the plane of the sheet representing the transistor 200). It will be seen hereafter (cf. FIG. 13) that a transistor according to an embodiment of the invention may comprise several conduction planes incorporating a conduction channel.

The tunnel effect transistor 200 is here an N type transistor comprising a PiN diode architecture including:
   a channel 201 made of an intrinsic semiconductor material (for example silicon); intrinsic semiconductor is taken to mean a semiconductor material in which the electrical behaviour only depends on its structure, and not on the addition of doping impurities; the channel 201 includes two parts of different thicknesses; a first part 212 of thickness ts1 and a second part 213 of thickness ts2 strictly greater than the thickness ts1. More precisely, the transistor 200 being a double gate transistor, the second part 213 is formed of a first diversion 213A extending along the direction 223 in a first direction (here the top in the case of FIG. 10) along a thickness ts2/2 strictly greater than ts1 and of a second diversion 213B extending along the direction 223 in the direction opposite to the first direction (here the bottom in the case of FIG. 10) along a thickness ts2/2 strictly greater than ts1;
   a source extension region 202 extending, along the longitudinal direction 222, the first part 212 of the channel 201 and made of a highly P doped semiconductor material of P+ type (for example Boron-doped Si); the source extension region 202 has a thickness ts1 substantially equal to the thickness of the first part 212;
   a first drain extension region 203A extending, along the direction 223 perpendicular to the plane of the channel 201, the first diversion 213A and made of a highly N doped semiconductor material of N+ type (for example Phosphorus-doped Si);
   a second drain extension region 203B extending, along the direction 223 perpendicular to the plane of the channel 201, the second diversion 213B and made of a highly N doped semiconductor material of N+ type (for example Phosphorus-doped Si);

a first barrier area 220A inserted, along the direction 223 over a thickness ts3, between the first diversion 213A and the first drain extension region 203A, the first barrier area 220A being made of a highly P doped semiconductor material of P+ type (for example Boron-doped Si);

a second barrier area 220B inserted, along the direction 223 over a thickness ts3, between the second diversion 213B and the second drain extension region 203B, the second barrier area 220B being made of a highly P doped semiconductor material of P+ type (for example Boron-doped Si).

According to this second embodiment, the P+ barrier areas 220A and 220B are thus inserted over a thickness ts3 along the direction 223 perpendicular to the plane of the channel between the end of the channel 201 and the drain extension area 203.

Beneficially, this thickness ts3 of each of the barrier areas 220A and 220B is comprised between 8 and 20 nm.

In an embodiment, the concentration of acceptors (to obtain a P+ type doping of each of the barrier areas 220A and 220B) is comprised between $10^{19}$ cm$^{-3}$ and $5 \cdot 10^{19}$ cm$^{-3}$. By way of comparison, the concentration of acceptor dopants in the source extension region 202 is comprised between $10^{20}$ cm$^{-3}$ and $5 \cdot 10^{20}$ cm$^{-3}$ (i.e. a concentration around ten times higher than that of the barrier areas 220A and 220B). Beneficially, the concentration of dopants (P+ type doping) of each of the barrier areas 220A and 220B is substantially equal to $3 \cdot 10^{19}$ cm$^{-3}$.

In a known manner, the transistor 200 further comprises:

an upper part 221 in the form of a series of successive components situated above the assembly formed by the channel 201 and the extension regions 202 and 203, in the longitudinal direction (marked by the arrow 222) of the channel from the source extension region and incorporating:
   a source conductive region 204;
   an arrangement 211 for forming a source insulating space between the sides opposite each other of the source conductive region 204 and of the gate structure 206 that follows;
   a gate structure 206 comprising:
      a gate dielectric layer 208; the material of the dielectric layer 208 may be a high-k type dielectric material such as HfO$_2$;
      a gate conductive area 207 above the gate dielectric layer 208 and in contact therewith; the material of the gate conductive area 207 is for example a metal;
   an arrangement 210 for forming a drain and channel insulating space between the sides opposite each other of the gate structure 206 and of the drain conductive region 205 that follows;
   a drain conductive region 205;

a lower part 221' in the form of a series of successive components situated below the assembly formed by the channel 201 and the extension regions 202 and 203, in the longitudinal direction (marked by the arrow 222) of the channel from the source extension region and incorporating:
   a source conductive region 204';
   an arrangement 211' for forming a source insulating space between the sides opposite each other of the source conductive region 204' and of the gate structure 206' that follows;
   a gate structure 206' comprising:
      a gate dielectric layer 208'; the material of the dielectric layer 208' may be a high-k type dielectric material such as HfO$_2$;
      a gate conductive area 207' above the gate dielectric layer 208' and in contact therewith; the material of the gate conductive area 207' is for example a metal;
   an arrangement 210' for forming a drain and channel insulating space between the sides opposite each other of the gate structure 206' and of the drain conductive region 205' that follows;
   a drain conductive region 205'.

In an embodiment, the assembly of spacer is made of a low-k dielectric material such as SiO$_2$, it being understood that these arrangements are not necessarily formed of a single material and/or of a single layer. The dimension LSP measured along the longitudinal direction 222 of the channel 201 of the spacer 210 and 210' is of the order of 5 nm. A vertical structure such as that of FIG. 10 precisely makes it possible to use spacers of smaller dimension (here 5 nm versus 15 nm in the case of the transistor of FIG. 6). It should moreover be noted that, even for spacers of reduced dimensions on the drain side, the ambipolar current always remains very low.

The p+ type barrier areas 220A and 220B allow to create a drain side barrier preventing the electrons from escaping from the drain and penetrating into the channel at strong VG and weak VD.

Figure 11:
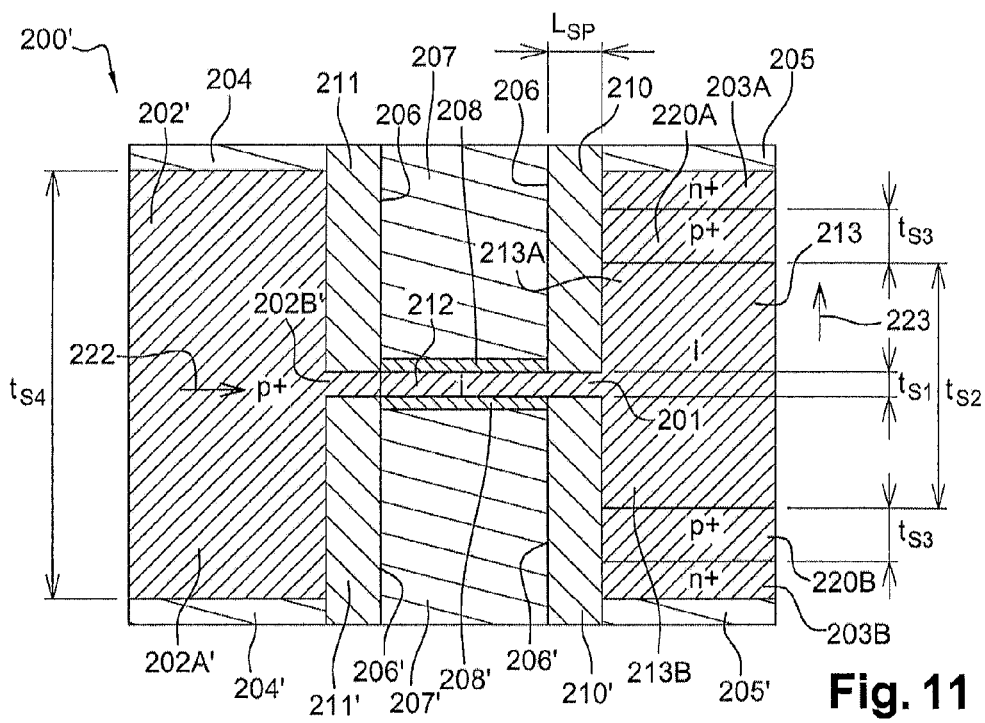
FIG. 11 represents schematically a variant of the transistor of FIG. 10 according to an embodiment of the invention.

FIG. 11 illustrates a tunnel effect transistor 200' which is an embodiment variant of the transistor 200 of FIG. 10.

The transistor 200' is substantially identical to the transistor 200 (identical characteristics bear the same references), the only difference consisting in using a raised source extension region 202' (versus the source extension region 202 of FIG. 10); according to this embodiment, the source extension region 202' includes two parts of different thicknesses; a first part 202A' of thickness ts4 and a second part 202B' of thickness ts1 strictly less than the thickness ts4 and substantially equal to the thickness of the first part 212 of the channel 201.

FIGS. 12a to 12f illustrate the steps of an embodiment of a method for manufacturing a transistor according to the invention which is here a single gate transistor. The example is that of an N type TFET.

Figure 12A:
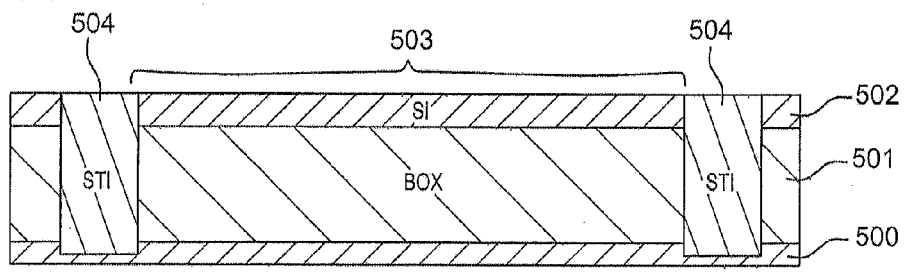
FIGS. 12a to 12f illustrate the steps of an embodiment of a method for manufacturing a transistor according to the invention.

According to the first step 401 illustrated in FIG. 12a, a substrate of semiconductor on insulator or SOI (Silicon On Insulator) type comprising a first semiconducting layer 500 is used, for example based on silicon on which lies an insulating layer 501 such as a buried oxide layer (BOX) based on SiO$_2$ (the BOX may be thick, for example over a thickness of 145 nm, or for example thin for the electrostatic control, for example over a thickness of 25 nm, or even 10 nm). One then has a thin semiconducting layer 502 (for example a thin film of silicon for example over a thickness less than 30 nm or even less than 10 nm for a "fully depleted" SOI technology).

According to this same step 401, the active area 503 is going to be defined, for example, by the formation of trenches 504. These trenches are formed by a shallow trench isolation (STI) method. In STI, a localised etching of the trenches in the SOI substrate is carried out. This step is followed by filling of the trenches 504 with silica.

The active area 503 may also be formed by MESA etching.

Figure 12B:
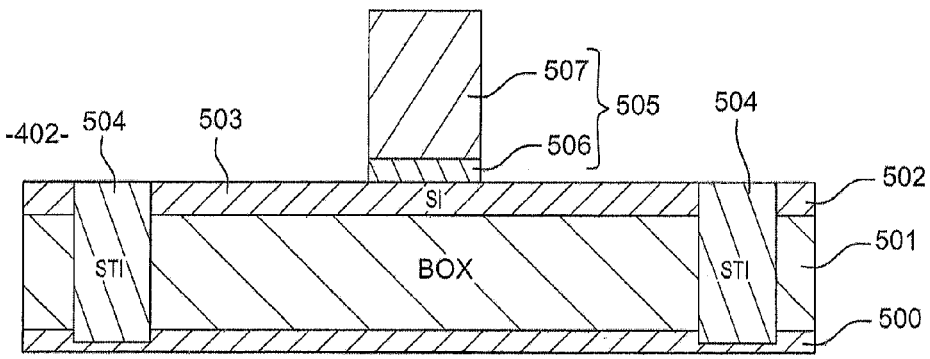

The second step 402 illustrated in FIG. 12b consists in forming the gate structure 505. To do so, for example a high-k dielectric layer 506 such as HfO$_2$ is deposited then a metal layer and/or doped polysilicon 507. The gate area 505 is then obtained by lithography and etching (with stoppage on the silicon layer 502) of the dielectric and metal/polySi layers deposited beforehand. It will be noted that it is also possible to deposit a hard mask (for example made of SiN) above the gate area 505 so as not to have silicon apparent on top of the gate area (and avoid an impact on the gate surface during forthcoming source and drain epitaxies).

Figure 12C:
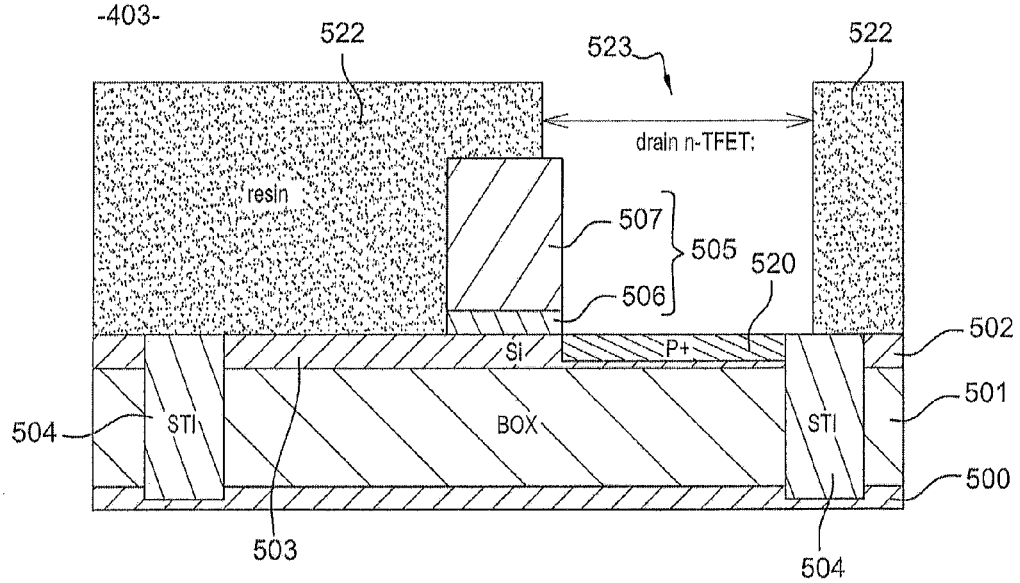

According to step 403 illustrated in FIG. 12*c*, the P+ doping is carried out on the area 520 intended to incorporate the future barrier area and the future drain extension region. This doping is carried out by defining firstly a resin caisson 522 in which the area to be doped is opened (the opening 523 is obtained by lithography). The open area is P+ doped by ion implantation (for example an implantation by B ions or BF2 ions). The resin caisson is then removed by a stripping or lift-off method.

Figure 12D:
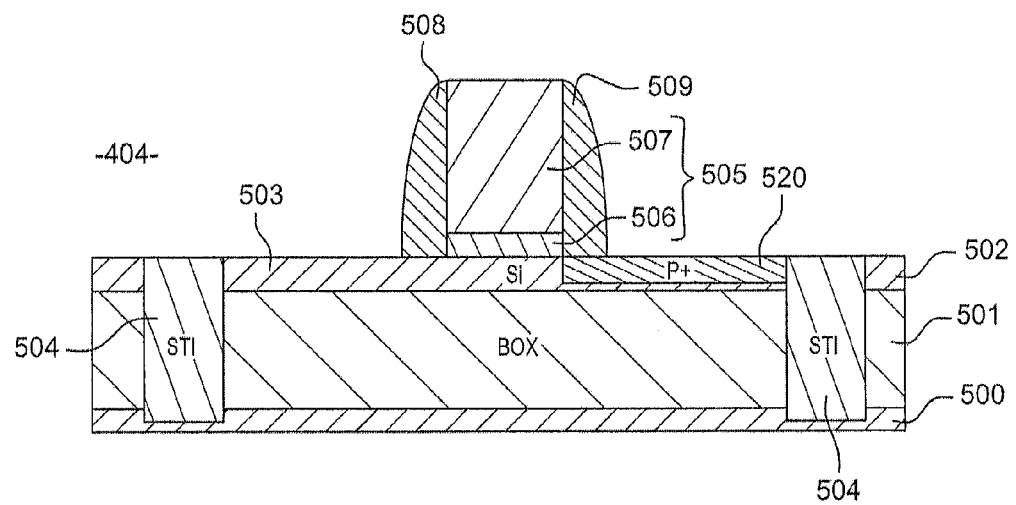

According to step 404 illustrated in FIG. 12*d*, the spacers 508 and 509 are defined (source and drain side equivalent to the spacers 111 and 110 of FIG. 6). This embodiment is for example obtained by carrying out a conforming deposition of a dielectric material of low-k type (such as $SiO_2$) over a thickness typically less than 20 nm followed by an anisotropic etching of RIE (Reactive Ion Etching) dry etching type. This anisotropic etching makes it possible to define the length of the spacers 508 and 509 (calculated along the longitudinal direction of the channel) typically comprised between 5 and 30 nm.

Figure 12E:
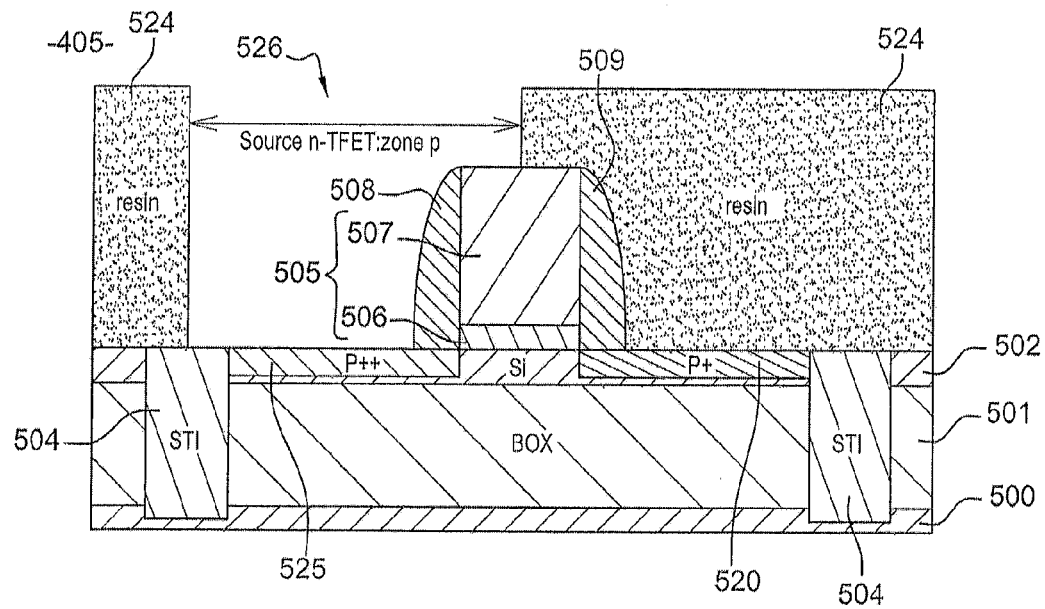

According to step 405 illustrated in FIG. 12*e*, the P+ doping of the source extension area 525 is performed. The doping is carried out by defining firstly a resin caisson 524 in which the area to be doped is opened (the opening 526 is achieved by lithography). The open area is P+ doped by ion implantation (for example an implantation by B ions or BF2 ions). The resin caisson is then removed by a "stripping" or "lift-off" type method.

Figure 12F:
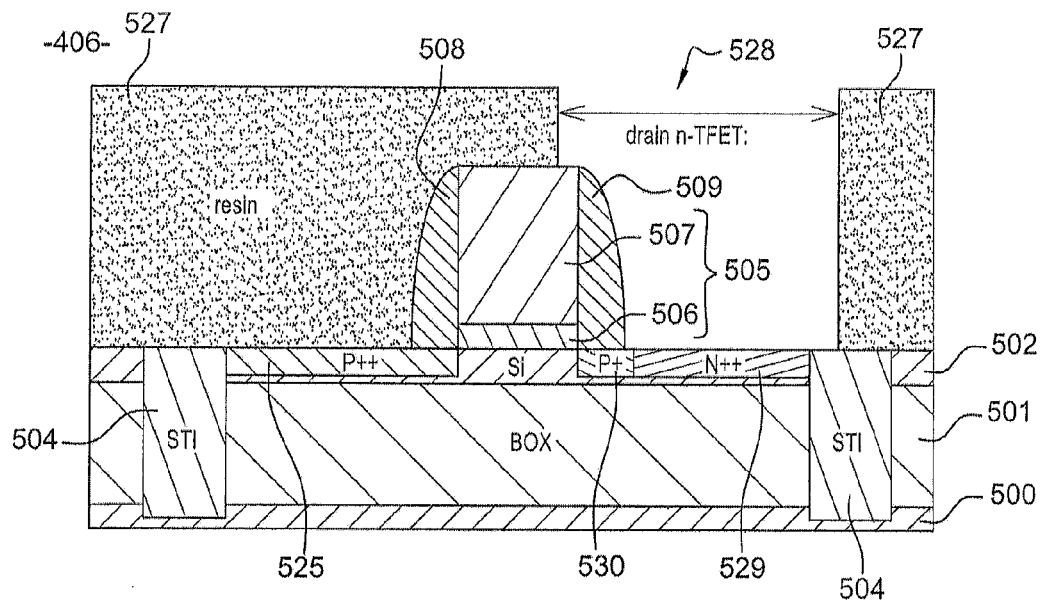

According to step 406 illustrated in FIG. 12*f*, the N+ doping of the drain extension area 529 (at the level of the region 520) is going to be carried out while leaving a P+ doped area 530 that will serve as barrier area. This doping is carried out by defining firstly a resin caisson 527 in which the area to be doped is opened (the opening 528 is achieved by lithography). The open area is N+ doped by ion implantation (for example an implantation by As or P ions).

According to the following step, not represented, the device according to an embodiment of the invention is finalised; to do so, the resin caisson 527 is removed by a stripping or lift-off type method. In order to activate the doping atoms and to mend defects due to the bombardment, an implantation annealing (also known as activation annealing) is then carried out.

Figure 13:
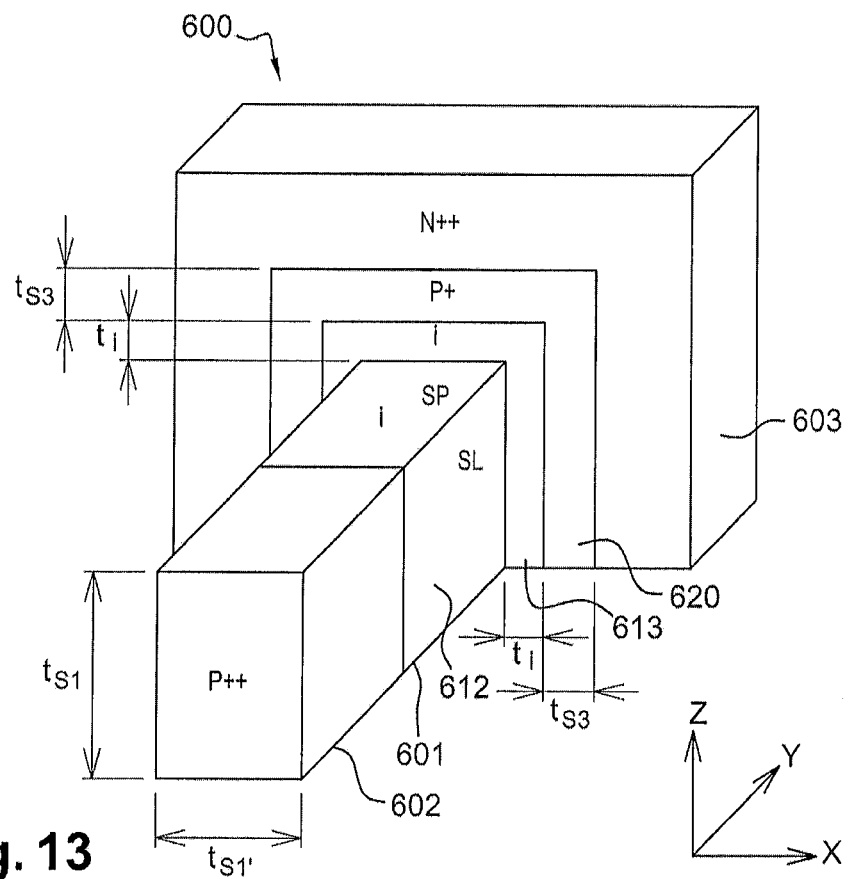
FIGS. 13 and 14 represent schematically the structure of a TFET tunnel effect transistor according to a third embodiment of the invention.

FIG. 13 represents schematically the structure of a multi-gate TFET tunnel effect transistor 600 in three dimensions (for example a Fin-TFET or "Trigate TFET" type transistor) according to a third embodiment of the invention. It will be noted that the aim of the drawing of FIG. 13 is uniquely to illustrate, very schematically, the structure of the transistor, it being understood that the real shapes will most usually not be rectangular but trapezoidal (the shapes being linked to the epitaxy processes used for the manufacture).

The transistors 100, 200 or 200' as described with reference to FIGS. 6, 10 and 11 each had a conduction channel contained in a single plane, known as conduction plane: these structures are structures with a single conduction surface. The structure of the transistor 600 represented schematically in FIG. 13 has on the other hand several conduction surfaces (here two or three surfaces corresponding respectively to the two lateral surfaces and the upper surface). The orientations of the different components forming the transistor will be made with regard to an orthogonal mark Oxyz.

Figure 14:
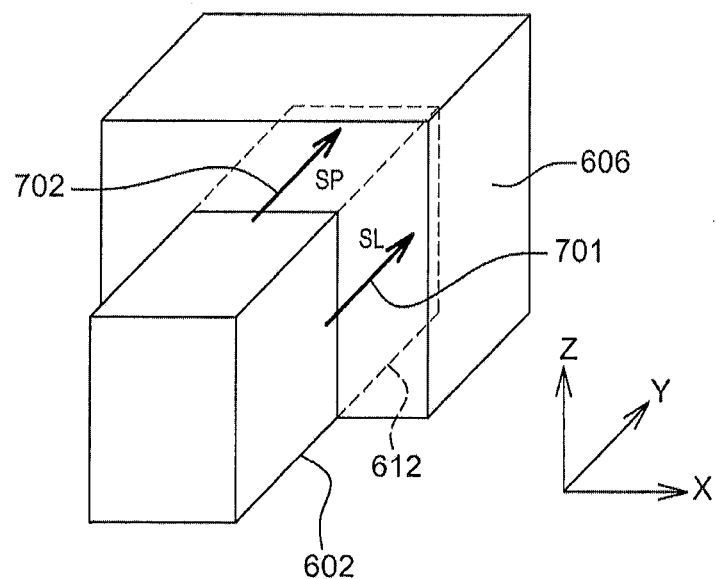

As previously, the tunnel effect transistor 600 is here an N type transistor comprising a PiN diode architecture. For the sake of clarity, the gate structure is not represented in FIG. 13 and will be illustrated with reference to FIG. 14 (which represents in a very schematic manner the gate structure around the channel); only components essential to the understanding of the invention are represented here, certain components such as for example the spacers having been voluntarily omitted to make FIG. 13 clearer.

Here, the source extension region 602, the channel region 601 and the source extension region 603 each have a certain thickness such that they may be qualified as three-dimensional.

The channel 601 is made of an intrinsic semiconductor material (for example silicon); this channel 601 includes two parts of different thicknesses (along the two directions Ox and Oz);

a first part 612 of thickness ts1 along Oz and of thickness ts1' along Ox;

and a second part 613 of thickness ts1+ti along Oz (thus strictly greater than ts1) and of thickness ts1'+ti along Ox (of which strictly greater than ts1').

The gate structure (cf. reference 606 of FIG. 14), not represented in FIG. 13, is going to cover the first part 612 of the channel on its two lateral surfaces (surface SL visible in FIGS. 13 and 14 and the opposite surface not visible) parallel to the plane Oyz and on its upper surface SP parallel to the plane Oxy. Contact thus takes place via the two sides (cf. arrow 701) and via the top (arrow 702), thus on three surfaces instead of one. It will be noted that, according to Fin-TFET technology, only the lateral surfaces are used whereas Trigate technology uses three surfaces. It will also be noted that it does not involve three different gates but a gate structure with three contact surfaces. According to this embodiment, it will easily be understood that the conduction channel is comprised as much in the two planes SL as in the plane SP, the carriers following quite well the arrows 701 as 702.

The source extension region 602 extends, along the direction of the movement of the carriers (here Oy), the first part 612 of the channel 601 and is made of a highly P doped semiconductor material of P+ type (for example Boron-doped Si); the source extension region 602 has a thickness ts1 substantially equal to the thickness of the first part 612 along the direction Oz and a thickness ts1' substantially equal to the thickness of the first part 612 along the direction Ox.

The drain extension region 603 covers the second part 613 of the channel on its two lateral surfaces parallel to the plane Oyz and on its upper surface parallel to the plane Oxy. The drain extension region is made of a highly N doped semiconductor material of N+ type (for example Phosphorus-doped Si).

According to an embodiment of the invention, the transistor 600 comprises a barrier area 620 inserted, over a thickness ts3, between the second part 613 and the drain extension region 603, the barrier area 620 being made of a highly P doped semiconductor material of P+ type (for example Boron-doped Si).

According to this third embodiment, the P+ barrier area 620 is thus inserted over a thickness ts3 along the directions Oz and Ox perpendicular to the conduction planes SP and SL containing the channel. The invention finds a particularly interesting application in the case of low power applications or low voltage electronics, for example in the case of the realisation of SRAM (Static Random Access Memory).

It will be appreciated that the transistor according to the invention is not limited to the embodiments that have been described by way of indication and in no way limiting, with reference to the figures.

Thus, even though the invention has been more particularly described in the case of an N type tunnel effect transistor, it is understood that it applies as much to a P type tunnel effect transistor by inverting the P and N doping of the source, drain semiconductive extension regions and the barrier area.

Moreover, even though the different curves have been obtained for double gate transistors, it is understood that similar results are obtained for a transistor according to the invention with single gate such as that represented in FIG. 12f. A double gate TFET comprises in fact the same components as those of a single gate tunnel effect transistor on its upper part with in addition a lower part (incorporating particularly the lower control gate) totally symmetrical with the upper part of the transistor with respect to the plane of the substrate. In all cases, according to the invention, an area doped according to a doping opposite to the doping of the drain extension region is inserted between the channel and the drain extension region.

The invention applies to any type of tunnel effect transistor structure, the embodiments described above being given purely for illustrative purposes.

Similarly, the invention applies whatever the type of substrate used (substrate of semiconductor on insulator or SOI (Silicon On Insulator) type or substrate of bulk type for example).

The invention claimed is:

1. A tunnel effect transistor comprising:
   a channel made of an intrinsic semiconductor material;
   source and drain extension regions on either side of said channel, said source extension region being made of a semiconductor material doped according to a first type of doping P or N and said drain extension region being made of a semiconductor material doped according to a second type of doping opposite to said first type of doping, said source extension region serving to inject by tunnel effect charge carriers into the channel;
   source and drain conductive regions respectively in contact with the source and drain extension regions;
   a gate structure comprising:
      a gate dielectric layer in contact with said channel, and
      a gate area arranged such that said gate dielectric layer is arranged between said gate area and said channel; and
   an area doped according to the first type of doping inserted between the channel and the drain extension region, said doped area forming a barrier that physically separates the channel from the drain extension region, thereby preventing any contact between the channel and the drain extension region and preventing the charge carriers from escaping from said drain extension region.

2. The transistor according to claim 1, wherein a concentration of dopants of said area doped according to the first type of doping is comprised between $10^{19}$ cm$^{-3}$ and $5 \cdot 10^{19}$ cm$^{-3}$.

3. The transistor according to claim 2, wherein the concentration of dopants of said area doped according to the first type of doping is substantially equal to $3 \cdot 10^{19}$ cm$^{-3}$.

4. The transistor according to claim 1, wherein said area doped according to the first type of doping is inserted over a given length measured along the longitudinal direction of the channel.

5. The transistor according to claim 4, wherein said length of said doped area is comprised between 5 and 20 nm.

6. The transistor according to claim 1, wherein said area doped according to the first type of doping is inserted over a given thickness measured perpendicularly to at least one conduction plane of said channel.

7. The transistor according to claim 6, wherein said thickness is comprised between 8 and 20 nm.

8. The transistor according to claim 6, comprising a spacer insulating the drain conductive region and the gate area, said spacer having a thickness measured parallel to the longitudinal direction of the channel and comprised between 5 nm and 10 nm.

9. The transistor according to claim 6, wherein said channel comprises:
   a first part oriented along the longitudinal direction of the channel and having a given thickness; and
   at least one diversion extending along a direction perpendicular to at least one conduction plane of the channel and having a thickness strictly greater than the thickness of the first part, said area doped according to the first type of doping being in the extension of said diversion.

10. The transistor according to claim 6, wherein said channel has at least two conduction planes, said area doped according to the first type of doping being inserted over a thickness measured perpendicularly to each of said conduction planes of said channel.

* * * * *